(12) United States Patent
Song

(10) Patent No.: US 6,917,660 B2
(45) Date of Patent: Jul. 12, 2005

(54) ADAPTIVE DE-SKEW CLOCK GENERATION

(75) Inventor: Hongjiang Song, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 935 days.

(21) Appl. No.: 09/873,820

(22) Filed: Jun. 4, 2001

(65) Prior Publication Data

US 2002/0181639 A1 Dec. 5, 2002

(51) Int. Cl.[7] ................................................ H03D 3/24
(52) U.S. Cl. .......................... 375/373; 370/519; 713/503
(58) Field of Search ................................ 375/355, 354, 375/371, 373, 376; 370/516, 517, 519; 713/400, 401, 500, 503; 327/141, 144, 149–150, 151–153, 156, 158–159, 161–163

(56) References Cited

U.S. PATENT DOCUMENTS

| | | | | |
|---|---|---|---|---|
| 4,841,551 A | * | 6/1989 | Avaneas | 375/371 |
| 5,220,581 A | * | 6/1993 | Ferraiolo et al. | 375/226 |
| 5,245,637 A | * | 9/1993 | Gersbach et al. | 375/374 |
| 5,488,641 A | * | 1/1996 | Ozkan | 375/374 |
| 5,854,797 A | * | 12/1998 | Schwartz et al. | 714/724 |
| 6,064,244 A | * | 5/2000 | Wakayama et al. | 327/158 |
| 6,066,969 A | * | 5/2000 | Kawasaki et al. | 327/156 |
| 6,182,236 B1 | * | 1/2001 | Culley et al. | 713/503 |
| 6,650,661 B1 | * | 11/2003 | Buchanan et al. | 370/516 |

OTHER PUBLICATIONS

Guang–Kaai Dehng, June–Ming Hsu, Ching–Yuan Yang, Shen–Iuan Liu, "Clock–Deskew Buffer Using a SAR–Controlled Delay–Locked Loop", Aug. 2000, IEEE Journal Of Solid–State Circuits, vol. 8, No. 8.*

* cited by examiner

Primary Examiner—Tesfaldet Bocure
Assistant Examiner—Khanh Tran
(74) Attorney, Agent, or Firm—John F. Travis

(57) ABSTRACT

A signal delay circuit that compensates for other delays introduced within the signal delay circuit itself. A delay-locked loop may produce multiple delayed clock signals, each having a defined phase difference with respect to, and representing a different delay from, a reference clock. A synchronization circuit may determine a first selection value that selects a first delayed clock whose delay compensates for the propagation delays created in a selection circuit. A selection circuit may add a specified offset value to the first selection value to produce a second selection value, and use the second selection value to select a second delayed clock whose delay approximates the sum of the internal delay of the selection circuit and the delay specified by the offset value.

20 Claims, 4 Drawing Sheets

ADAPTIVE DE-SKEW CLOCK GENERATION

BACKGROUND OF THE INVENTION

1. Field of the Invention

The invention pertains generally to computers. In particular, it pertains to clock logic in digital circuits.

2. Description of the Related Art

The growing demand for higher performance in devices such as central processing units (CPU) and dynamic random access memories (DRAM) requires faster clocks to drive the circuits in such devices. Synchronizing the operation of different parts of a device can present a major challenge, since the few nanoseconds required to propagate a signal from one circuit to another, or from one part of the integrated circuit to another, may be equivalent to a major part of a single clock cycle. A conventional approach to this dilemma is to generate the different clocks inside the individual circuits, and synchronize those clocks to a reference clock using phase-locked loop (PLL) or delay-locked loop (DLL) circuits.

However, in many cases, it is required that the regenerated clock is not only capable of synchronizing to the reference clock, but is also delayed from that clock by a predetermined amount of time. Simple PLL and DLL circuits are not suited for this because they do not compensate for additional delays that may occur after the synchronized clock signals are produced.

DETAILED DESCRIPTION OF THE INVENTION

Various embodiments of the invention provide an output clock signal that is delayed from a reference clock signal by a selectable, predetermined amount, with compensation for variations in the delay caused by the output circuit.

Figure 1A:
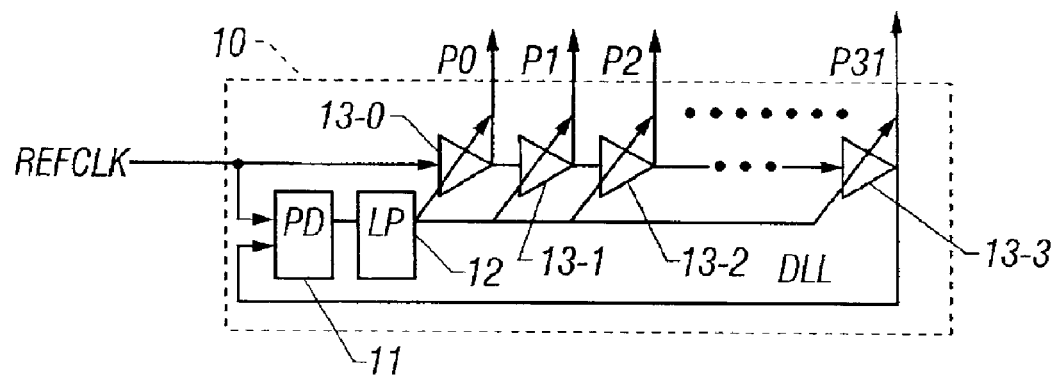
FIGS. 1a and 1b show a delay loop circuit and associated timing diagram.
Figure 1B:
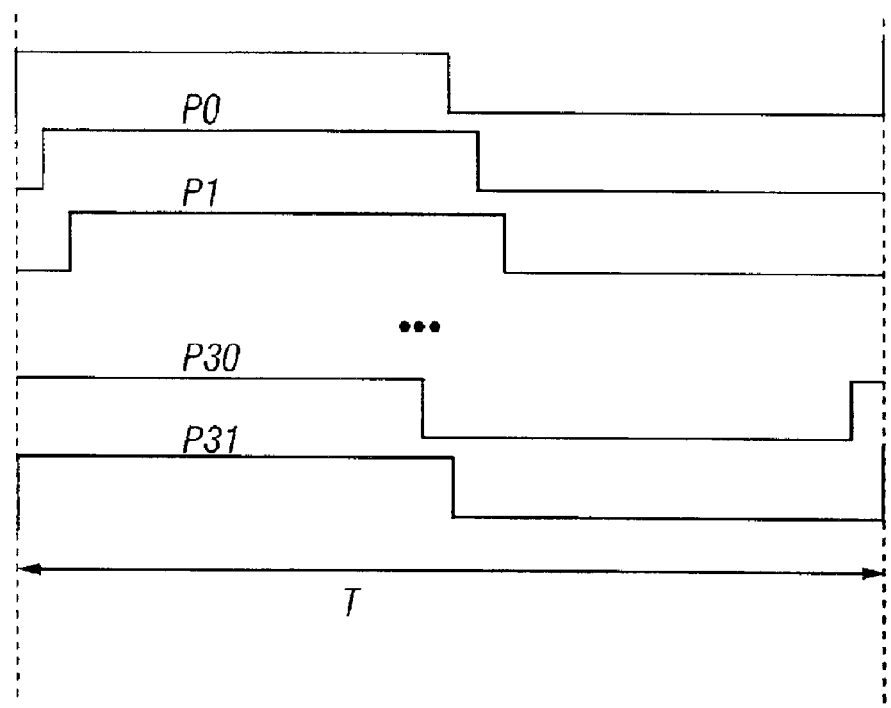

FIG. 1a shows a multiple-clock delay circuit that can produce multiple delayed versions of a reference clock. In one embodiment, the multiple-clock delay circuit may be a delay-locked loop (DLL) 10. In the illustrated embodiment, the reference clock 'REFCLK', goes through a voltage controlled delay line in the form of a series of controllable delay elements 13-0 through 13-31, which produce delayed clock signals P0 through P31. By feeding back the final output to a phase detector 11, which is connected to a low pass filter 12, the voltage output of low pass filter 12 may be used to regulate the delay elements so that each provides a delay equal to 1/32 of the cycle time of REFCLK. This permits DLL 10 to provide 32 outputs with 32 clock signals, each delayed by 1/32 of a cycle from the preceeding clock signal, as shown in FIG. 1b. Although the illustrated embodiment shows 32 outputs, other embodiments may provide n delayed clock signals, each delayed from the previous clock signal by 1/n cycles of the reference clock. A multiplexer may be used to select one of the outputs for use as a clock input to a data buffer, which in turn may provide clocked data at its output. However, both the multiplexer and the data buffer have their own inherent delays, which may vary due to environmental factors (temperature, voltage, loading, etc.), and may vary from one device to another due to process variations during manufacture. These unpredictable delays may be added to the selected delay, which may make the timing of the final data output unpredictable if these factors are not compensated for.

Figure 2A:
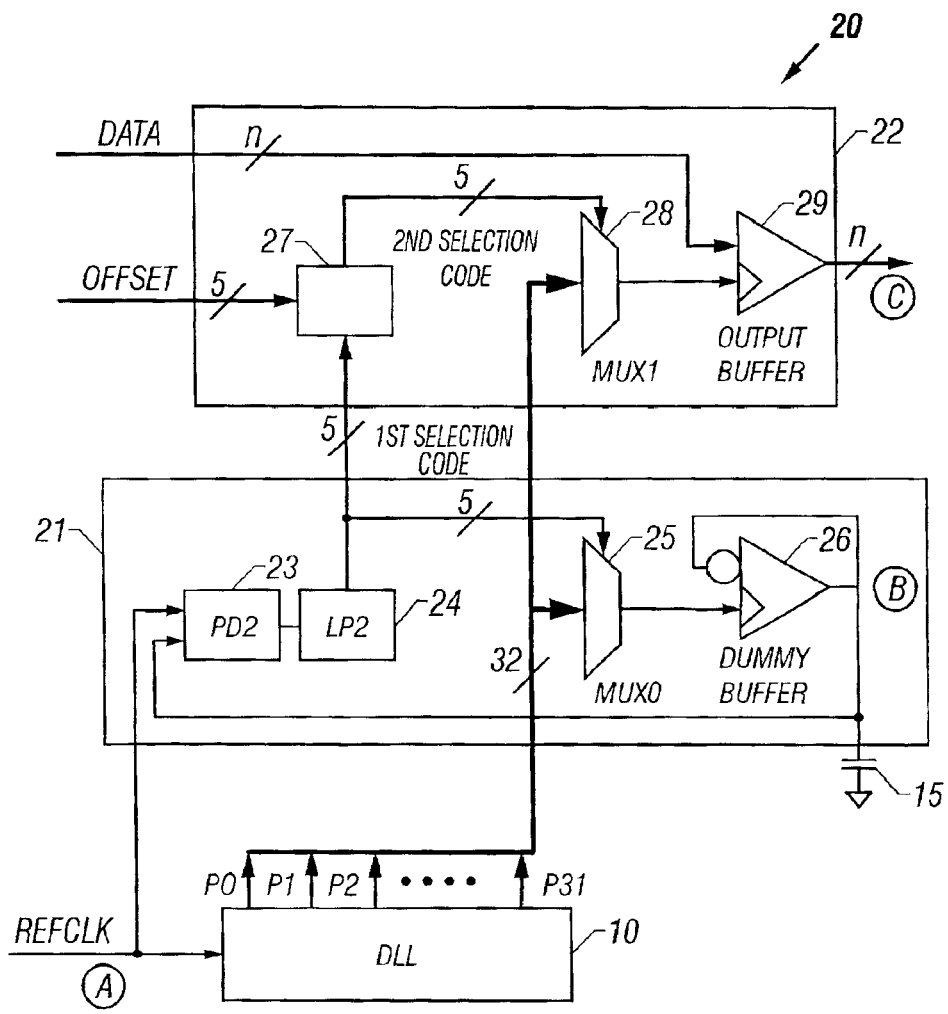
FIGS. 2a and 2b show a clock delay control circuit and associated timing diagram.

FIG. 2a shows a clock delay control (CDC) circuit 20 that may compensate for these unpredictable delays. A multiple-clock delay circuit, in the form of DLL 10, may provide the multiple delayed clock outputs as previously described, shown as P0 through P31. Synchronization circuit 21 may be used to determine the additional delays that are inherent in the final output circuit, and convert those delays into an equivalent DLL delay value. Offset selection circuit 22 may receive the desired offset delay value and add that to the equivalent DLL delay value to produce a final delay value that offsets the clocked data from the reference clock by the offset amount.

Figure 2B:
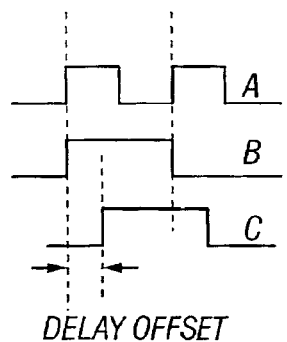
Figure 3:
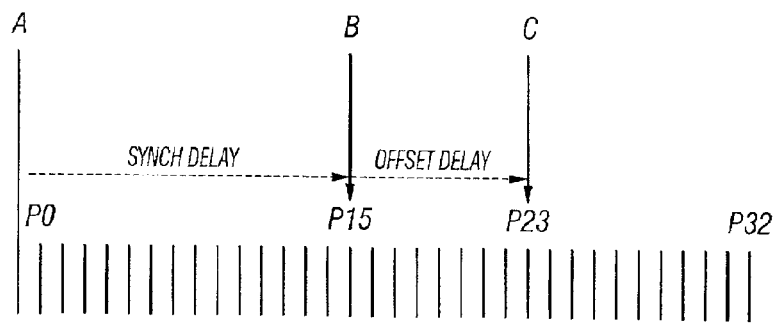
FIG. 3 shows how delays may be summed to produce a total delay.

FIG. 3 shows the phase relationship between the various clock signals, with the circled symbols A, B, and C representing common points (such as the leading edge) of the clock signals A, B, and C in FIGS. 2a and 2b. If phases P0 through P31 add up to one full cycle of the reference clock REFCLK, then synchronization circuit 21 may produce a five-bit selection value that selects the delay needed to equal the delay through multiplexer 25 and dummy buffer 26. In the illustrated embodiment of FIG. 3, P15 provides that necessary delay, so that the clock signal B is synchronized with REFCLK. Offset selection circuit 22 may then add the selected offset to this delay to produce the final delay necessary for clock signal C. In the illustrated embodiment of FIG. 3, the selected offset is 1/4 of the cycle of REFCLK, or an additional 8 phase delays from DLL 10. This adds up to a total delay that is represented by P23, which is the phase delay seen by clock signal C. Thus, any transition in data signals at C will have the desired offset delay from REFCLK, while simultaneously canceling out any delays through the output buffer, although the exact delays created by the output buffer may not be known in advance.

Returning to FIG. 2a, these functions are described in more detail in the following paragraphs, which assume a DLL that provides 32 different delayed clock signals, with 5-bit selection values to select from among those 32 delayed clock signals. However, other quantities of delayed clock signals, with a corresponding number of bits in the selection values, may also be used.

In one embodiment, the circuit of DLL 10 may be as described in FIG. 1a, but other circuits may be used to provide the series of progressively delayed clock signals P0 through P31 as shown in FIG. 1b. These delayed clock signals may be provided to synchronization circuit 21 and offset selection circuit 22.

Synchronization circuit 21 may include phase detector 23 and digital low pass filter 24, which are labeled PD2 and LP2, respectively, to distinguish them from phase detector PD and digital low pass filter LP in FIG. 1a. The output of digital low pass filter 24 may be a selection value sent to multiplexer 25, which may select one of the outputs P0–P31 from DLL 10. This selection value is labeled '1st selection code' in the drawings to distinguish it from another selection value to be described later and to indicate it is represented by a binary number in this embodiment. The delayed clock signal selected by this selection code may then be provided as an input to the clock input of dummy buffer 26. An inverted version of the output of dummy buffer 26 may be fed back to its input, so that intermediate clock signal B becomes a series of pulses with half the frequency of REFCLK.

One purpose of dummy buffer 26 may be to simulate at least one characteristic of output buffer 29, which may provide the final output signals for CDC 20. Dummy buffer 26 may therefore be constructed similarly to output buffer 29, using the same technology and architecture to provide the same inherent delays. In one embodiment, both buffers are constructed on the same integrated circuit so they may experience the same process conditions and therefore should not have different delays due to process variations. Both buffers may be located physically close to each other so that they will experience the same operating temperatures. The load seen at the output of output buffer 29 may also affect its delays, so the load conditions may also be simulated with dummy buffer 26. However, if output buffer 29 drives a load that is external to the integrated circuit containing output buffer 29, the load conditions may not be known at the time of manufacture. Therefore, in one embodiment an external component such as capacitor 15 may be connected to the output of dummy buffer 26, so that the load on dummy buffer 26 may be matched to the actual load experienced by output buffer 29 in a particular application. In another embodiment, the loading on output buffer 29 may be internal to the integrated circuit and therefore predictable, so that load component 15 may also be internal to the integrated circuit.

Phase detector 23 may compare the phase relationship between the signals A and B, and produce an output indicating that phase relationship. In one embodiment, the output of phase detector 23 may be a one-bit binary signal, with one state indicating that clock signal A leads clock signal B, and the other state indicating that clock signal B leads clock signal A. This output may be a latched signal, with the latch clocked by REFCLK so that the output may change only in synchronism with REFCLK. One such phase detector is described in U.S. patent application Ser. No. 09/476,382 by the same inventor, filed Dec. 30, 1999, but other phase detectors may also be used.

Digital low pass filter 24 may include an up/down counter, clocked by REFCLK, with the direction of counting controlled by the output of phase detector 23. The output of this counter may be the first selection value sent to the selection input of multiplexer 25. In one embodiment, if clock signal B (REFCLK) leads clock signal A, the output of phase detector 23 may cause the counter to count up, which progressively selects DLL outputs that are progressively more delayed. When the counter finally selects a delay that causes clock signal A to lead clock signal B, the output of phase detector 23 may switch, causing the counter to count down. When clock signal B leads clock signal A again, which may occur after one clock cycle, the counter may begin to count up again. In this embodiment, a point of equilibrium may be reached when the counter repeatedly oscillates between two delay values, which may be adjacent delay values, depending on the response time of the feedback loop. Either delay value, or any delay value between them, may be considered the selected delay value that causes clock signal B to be synchronized with clock signal A, at least within the accuracy of synchronizing circuit 21. In another embodiment, phase detector 23 may have not only a lead/lag phase indication, but also an indicator that the two clocks are in phase within a given tolerance. In this embodiment, the counter may be stopped at a single delay value rather than oscillating between values. Regardless of how it is derived, the selected delay value may approximate the amount of signal delay caused by multiplexer 25 and dummy buffer 26, as influenced by load 15, which should in turn approximate the amount of signal delay caused by multiplexer 28 and output buffer 29, as influenced by the load on the output of output buffer 29.

Selection circuit 22 may include an input to receive an offset value representing a predetermined amount of delay to be injected into the output signal(s) of output buffer 29. In the illustrated embodiment this input is shown as a 5-bit binary input to correspond to the 32 inputs of multiplexer 28. Selection circuit 22 may also include summation circuit 27 to add this offset value to the selection value being used in synchronization circuit 21. Adding these two terms together produces a selection value that may be sent to multiplexer 28 to select from among the thirty two input lines to multiplexer 28. This selection value is labeled '2nd selection code' in the drawings to distinguish it from the 'first selection code' of synchronization circuit 21. The value of the 2nd selection value is therefore the sum of the 1st selection value and the offset value. The output of multiplexer 28 may be a clock signal that is delayed from REFCLK by an amount equal to the delay determined by synchronization circuit 21 plus the delay specified by the offset value. This clock signal may be used to clock data into output buffer 29, which is shown receiving n-bits of data from another source. In one embodiment, output buffer 29 may comprise bus drivers, with its clock input from multiplexer 29 being used to enable the buffer outputs. In another embodiment, output buffer 29 may comprise latches, with a specified edge of the clock signal from multiplexer 28 being used to latch the data into output buffer 29.

Figure 4:
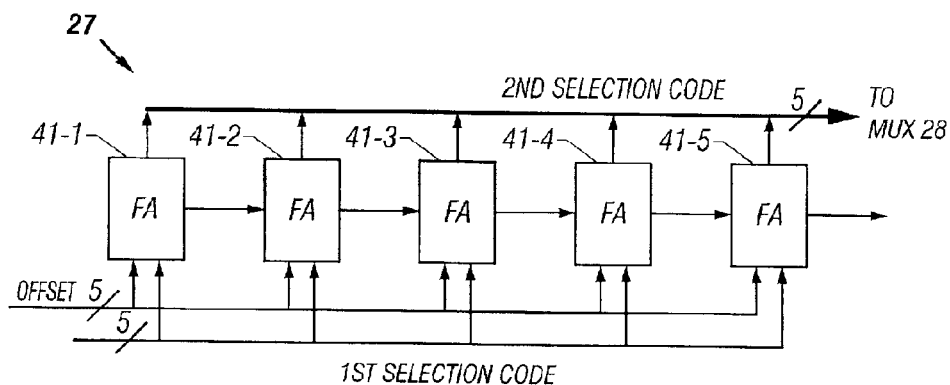
FIG. 4 shows a full adder circuit.

Summation circuit 27 may be a full adder, as shown in FIG. 4. Stage 41-1 may contain the least significant bit (LSB) of the 5-bit adder shown, with stage 41-5 containing the most significant bit (MSB). Since the delays from DLL 10 represent fractional parts of a continuously repeating clock cycle, the use of a carry bit from the adder would place the delay into the next clock cycle, with the same phase relationship that would exist if the carry bit were dropped, thus making the use of a carry bit superfluous. Therefore, one embodiment does not use the carry bit from stage 41-5.

Returning to FIGS. 2a and 3, the delayed clock signal from DLL 10 that is selected in synchronization circuit 21 may be the clock signal that causes the output of dummy buffer 26 to be synchronized with REFCLK. In the example of FIG. 3, this is shown as delayed clock P15, which delays REFCLK by $16/32$ of an REFCLK cycle, and makes the 1st selection value equal to 10000b. This delay is equivalent to the combined signal delays encountered in multiplexer 25 and dummy buffer 26, including any delay effects induced by the loading of component 15. The delayed clock signal from DLL 10 that is selected by selection circuit 22 may be the clock signal that provides the delay in synchronization circuit 21, plus the delay specified by the offset value. In the example of FIG. 3, the offset delay is shown as $8/32$ of an REFCLK cycle, so the offset binary value would be 01000b, and the 2nd selection value would be 10000b+01000b= 1000b. This gives a total delay of $24/32$ of a REFCLK cycle, which is the delay provided by DLL clock output P23.

Figure 5:
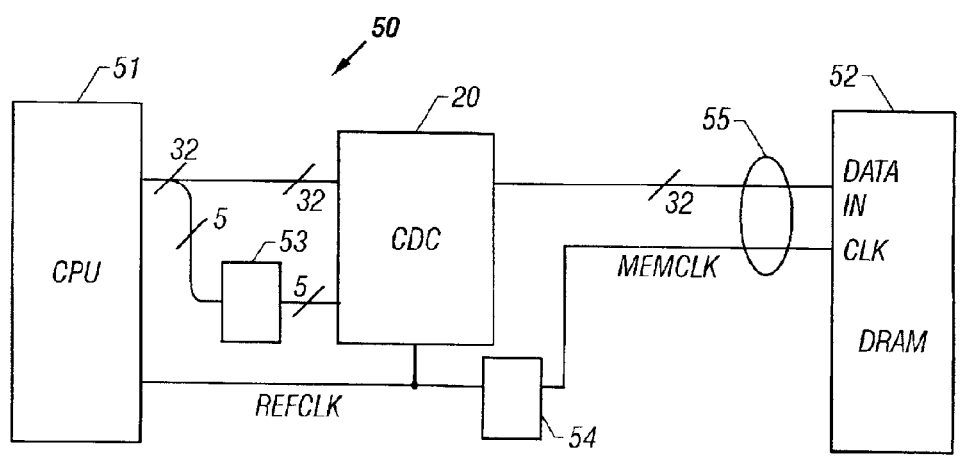
FIG. 5 shows a system embodiment.

FIG. 5 shows a system embodiment. CDC 20 may receive data from CPU 51, which it may then forward to dynamic random access memory (DRAM) 52 over memory bus 55, using the correct timing relationships. In some embodiments, DRAM 52 may be a synchronous DRAM (SDRAM). In the illustrated embodiment, both CPU 51 and DRAM 52 may transfer data thirty-two parallel bits at a time. Previous to transferring data, CPU 51 may use the five least significant bits of the data bus to write an offset code into a 5-bit latch 53, from where the offset code can be used by CDC 20. Memory bus clock signal MEMCLK may be used to provide the timing relationships to DRAM 52 for reading data on the 32-bit memory bus 55. Because all signals on memory bus 55 may require buffering to handle the loading requirements of a bus, clock signal REFCLK may be sent through buffer 54 before being placed on the memory bus as MEMCLK. Buffer 54 may also modify the received REFCLK signal in other ways, such as dividing its frequency in half, before generating MEMCLK.

Because of the various signal paths involved, MEMCLK may not have the correct phase relationship to the data signals going to DRAM 52. This problem may be corrected by CDC 20. Referring back to FIG. 2*a*, selection circuit 22 may delay the data clocking signal by the offset value loaded into latch 53 to compensate for the delay of the memory bus clock through buffer 54. However, selection circuit 22 may introduce its own delays into the signal paths. To compensate for this, synchronization circuit 21 may select a delay that synchronizes an intermediate clock signal with REFCLK, using a circuit that simulates the delays introduced by selection circuit 22. The selected delay in the synchronization circuit may then be added to the delay specified by the offset value to produce an output signal whose phase is delayed from REFCLK by the offset value. Thus, when MEMCLK and the data on memory bus 55 reach DRAM 52, they will have the correct phase relationship to each other. This is only one example of how CDC 20 can compensate for the delays inherent in the data bus drivers, its own internal delays, and other delays that may have an effect on phase relationships.

Figure 6:
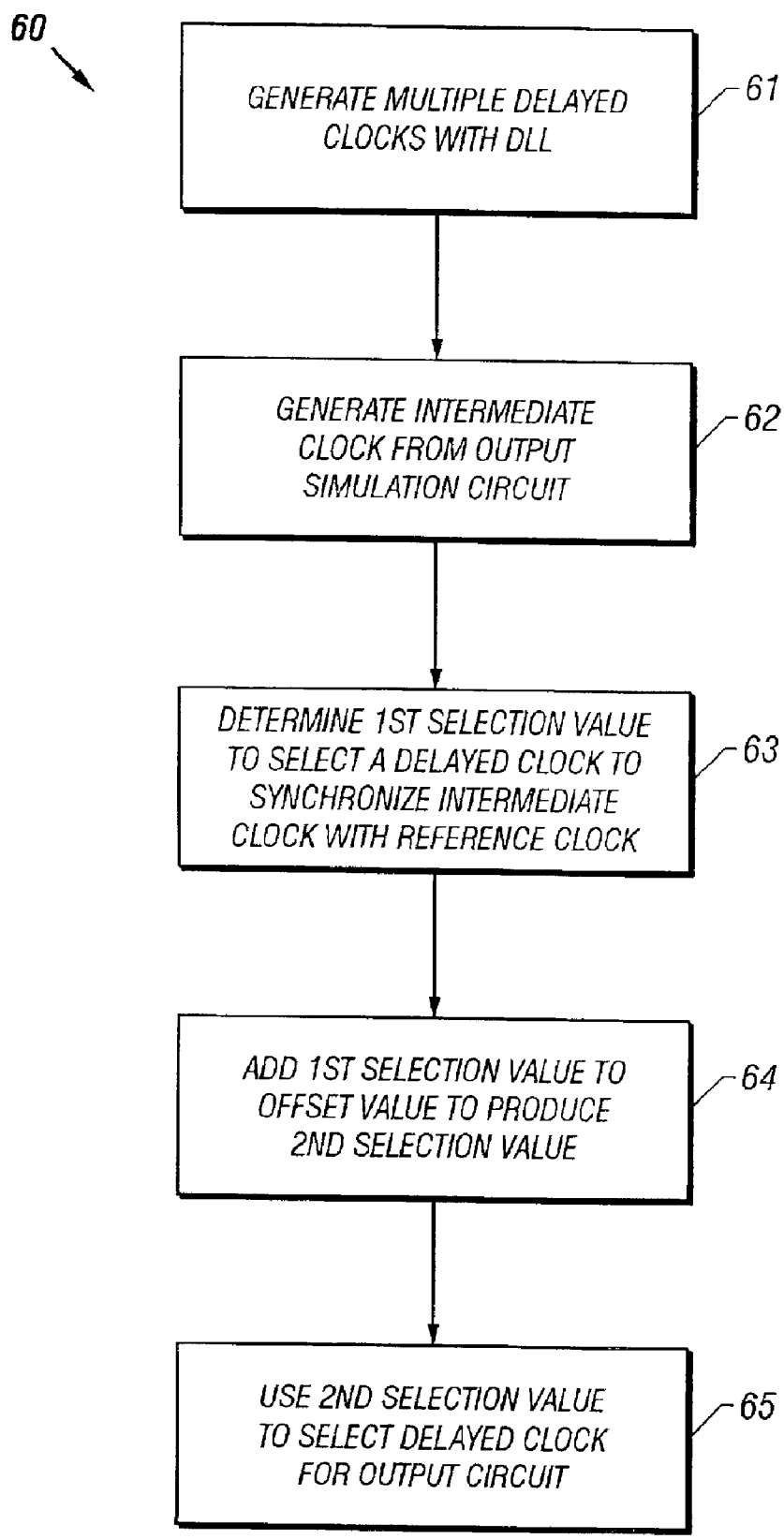
FIG. 6 shows a flow chart of a method.

FIG. 6 shows a flow diagram 60 of a method embodiment. At block 61, multiple delayed clocks may be generated. In one embodiment, a DLL is used to produce the multiple delayed clocks, with each clock delayed from the previous clock by a predetermined amount such that the phase delays of the multiple clocks span a single cycle of a reference clock. At block 62, an intermediate clock may be generated from a simulation circuit that simulates an output circuit. In one embodiment, the simulation circuit approximates the signal delay and output loading of the output circuit. At block 63, the intermediate clock may be synchronized with the reference clock by using a first selection value to select the one of the multiple delayed clocks that produces synchronization. In one embodiment, a phase detector and an up/down counter may be used to provide this synchronization and produce the first selection value. At block 64, the first selection value is added to an offset value to produce a second selection value. In one embodiment, this addition may be performed by a full adder circuit. In block 65, the second selection value may be used to select another of the delayed clocks for the output circuit. In one embodiment, this selection may cause the phase of the signal from the output circuit to be delayed from the phase of the intermediate clock by an amount specified by the offset value.

The foregoing description is intended to be illustrative and not limiting. Variations will occur to those of skill in the art. Those variations are intended to be included in the invention, which is limited only by the spirit and scope of the appended claims.

I claim:

1. An apparatus, comprising:
a multiple-clock delay circuit to receive a reference clock signal and to provide multiple delayed output clock signals;
a selection circuit to receive an offset value and to receive the multiple delayed output clock signals, the selection circuit including an output circuit having an output load to output data timed with a first selected one of the multiple delayed output clock signals; and
a synchronization circuit coupled to the multiple-clock delay circuit and the selection circuit and having a load simulation circuit to simulate the output load, the synchronization circuit to receive the reference clock signal and the multiple delayed output clock signals.

2. The apparatus of claim 1, wherein:
the multiple-clock delay circuit includes a delay-locked loop circuit.

3. The apparatus of claim 1, wherein:
the synchronization circuit includes a first multiplexer to select a second selected one of the multiple delayed output clock signals to synchronize an intermediate clock signal with the reference signal.

4. The apparatus of claim 3, wherein:
the synchronization circuit includes a phase detector coupled to the multiplexer to detect a phase relationship between the reference clock signal and the intermediate clock signal.

5. The apparatus of claim 4, wherein:
the synchronization circuit includes an up/down counter coupled to the phase detector and the first multiplexer.

6. The apparatus of claim 1, wherein:
the selection circuit includes an adder circuit to add the first selection value to an offset value to produce a second selection value.

7. The apparatus of claim 6, wherein:
the selection circuit includes a second multiplexer coupled to the adder circuit to select a second one of the delayed output clock signals with the second selection value.

8. A system, comprising:
a processor;
a synchronous dynamic random access memory; and
a clock delay control circuit coupled to the processor and the memory, the clock delay control circuit including:
a multiple-clock delay circuit to receive a reference clock signal and to provide multiple delayed output clock signals;
a selection circuit to receive an offset value and to receive the multiple delayed output clock signals, the selection circuit including an output circuit having an output load to output data timed with a first selected one of the multiple delayed output clock signals; and
a synchronization circuit coupled to the multiple-clock delay circuit and the selection circuit and having a load simulation circuit to simulate the output load, the synchronization circuit to receive the reference clock signal and the multiple delayed output clock signals.

9. The system of claim 8, wherein:
the multiple-clock delay circuit includes a delay-locked loop circuit.

10. The system of claim 8, wherein:
the synchronization circuit includes a first multiplexer to select a second selected one of the multiple delayed output clock signals to synchronize an intermediate clock signal with the reference signal.

11. The system of claim 10, wherein:

the synchronization circuit includes a phase detector coupled to the multiplexer to detect a phase relationship between the reference clock signal and the intermediate clock signal.

12. The system of claim 11, wherein:

the synchronization circuit includes an up/down counter coupled to the phase detector and the first multiplexer.

13. The system of claim 8, wherein:

the selection circuit includes an adder circuit to add the first selection value to an offset value to produce a second selection value.

14. The system of claim 13, wherein:

the selection circuit includes a second multiplexer coupled to the adder circuit to select a second one of the delayed output clock signals with the second selection value.

15. A method, comprising:

providing multiple delayed clock signals;

producing an intermediate clock from an output simulation circuit that simulates at least one characteristic of an output circuit;

determining a selection value that selects one of the delayed clock signals to synchronize the intermediate clock with a reference clock; and adding an offset value to the selection value to select another of the delayed clock signals to provide an output signal from the output circuit, a phase of the output signal being delayed from the intermediate clock by an amount specified by the offset value.

16. The method of claim 15, wherein:

determining a selection value includes using a phase detector to determine a phase relationship between the intermediate clock and the reference clock.

17. The method of claim 15, wherein:

determining a selection value includes using an up/down counter to select said one of the delayed clock signals.

18. The method of claim 15, wherein:

said at least one characteristic includes a signal delay in the output circuit.

19. The method of claim 15, wherein:

said at least one characteristic includes an output load on the output circuit.

20. The method of claim 15, wherein:

providing multiple delayed clock signals includes providing clock signals with phase delays spanning a single cycle of the reference clock.

* * * * *

UNITED STATES PATENT AND TRADEMARK OFFICE
CERTIFICATE OF CORRECTION

| | |
|---|---|
| PATENT NO. | : 6,917,660 B2 |
| DATED | : July 12, 2005 |
| INVENTOR(S) | : Song |

It is certified that error appears in the above-identified patent and that said Letters Patent is hereby corrected as shown below:

<u>Column 4,</u>
Line 62, delete "1000b" and insert -- 11000b --.

Signed and Sealed this

Sixth Day of September, 2005

JON W. DUDAS
*Director of the United States Patent and Trademark Office*